(12) United States Patent
Gaber

(10) Patent No.: US 7,829,874 B2
(45) Date of Patent: Nov. 9, 2010

(54) UNIVERSAL SELF-CONTAINED PROXIMITY SENSOR FOR ATTACHMENT TO A NIGHT-VISION DEVICE

(75) Inventor: Leonid Gaber, San Leandro, CA (US)

(73) Assignee: American Technologies Network Corporation CA (US)

( * ) Notice: Subject to any disclaimer, the term of this patent is extended or adjusted under 35 U.S.C. 154(b) by 163 days.

(21) Appl. No.: 12/228,992

(22) Filed: Aug. 20, 2008

(65) Prior Publication Data

US 2010/0046148 A1    Feb. 25, 2010

(51) Int. Cl.
  *H05K 7/00* (2006.01)
(52) U.S. Cl. .......................... 250/559.29; 250/214 VT; 250/239; 340/686.6
(58) Field of Classification Search ........... 250/214 VT, 250/239, 559.29–559.38; 340/686.6, 555, 340/561, 562
See application file for complete search history.

(56) References Cited

U.S. PATENT DOCUMENTS

| | | | |
|---|---|---|---|
| 6,087,660 A | | 7/2000 | Morris et al. |
| 6,307,384 B2 | | 10/2001 | Havey et al. |
| 6,862,748 B2 * | | 3/2005 | Prendergast ................ 335/205 |
| 6,898,890 B2 * | | 5/2005 | Gaber .................. 250/214 LA |
| 7,315,254 B2 | | 1/2008 | Smith et al. |

OTHER PUBLICATIONS

Monocular ATN MO4-1 produced by American Technology Network (ATN). A first-generation night-vision monocular with built-in smart technology in the form of a proximity sensor that automatically turns on the night-vision scope when it is brought in the viewing position.
A high-performance, hand-held, night-vision monocular PS-14 produced by American Technology Network (ATN). The device provides a wide 40° field-of-view and up to 45 hours of operation on two 1.5-volt AA batteries.

* cited by examiner

*Primary Examiner*—Seung C Sohn

(57) ABSTRACT

A universal self-contained proximity sensor for attachment to any night-vision device that does not have such a sensor or for replacement of the existing sensor. The proposed sensor has a cable with a connection cap that connects terminal contacts of the sensor with the master battery of the night-vision device and can be mechanically connected to the master-battery compartment of the night-vision device by replacing the existing cap of mastery-battery compartment. The sensor can be attached to any selected area on the surface of the night-vision device by means of tiny hooks and loops known under trademark Velcro®. This attachment is carried out with the use of two parts, one of which is adhesively attached to the substrate of the sensor and the other to the housing of the night-vision device, while both parts engage through the aforementioned tiny hooks and loops.

20 Claims, 5 Drawing Sheets

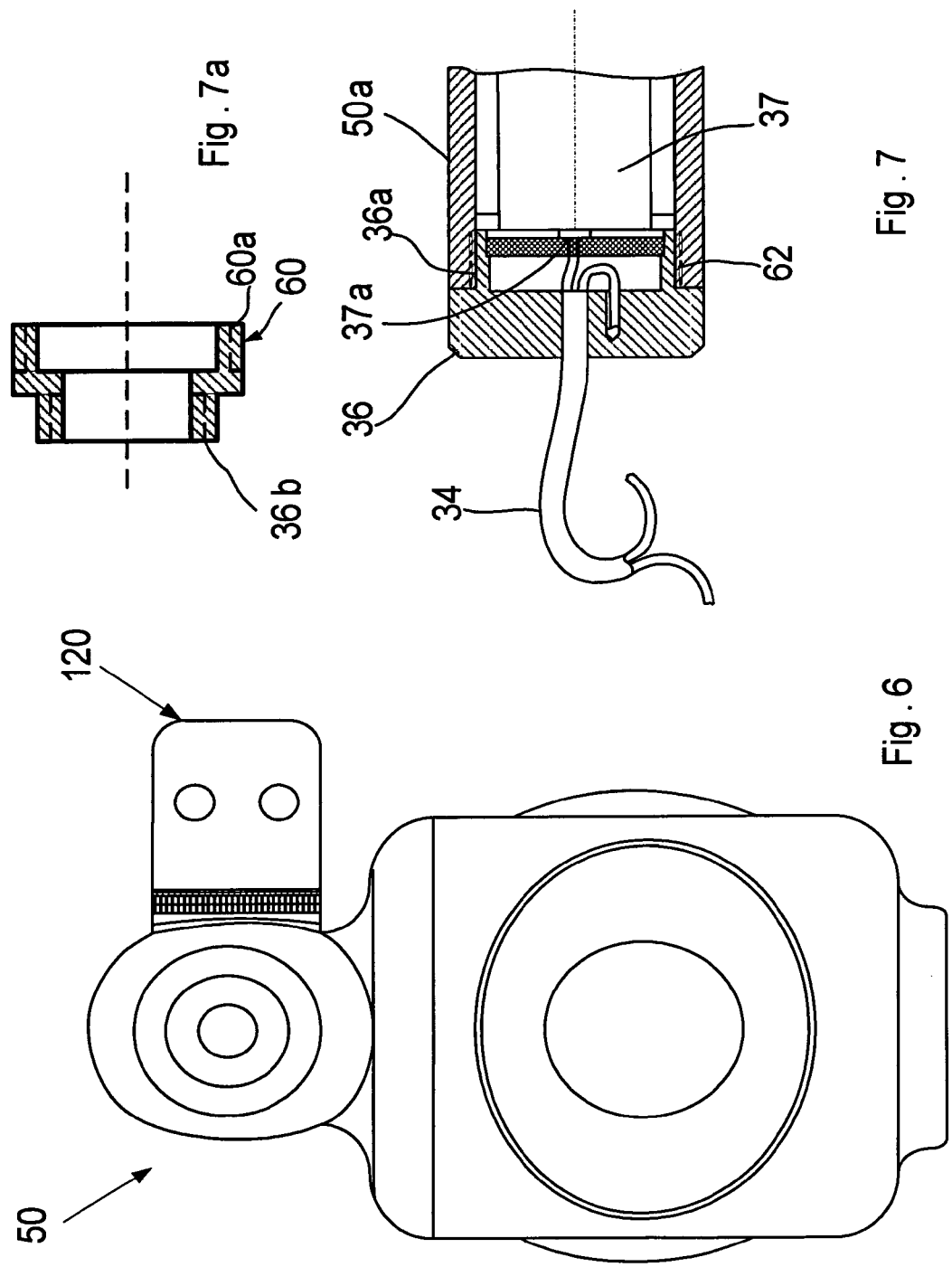

UNIVERSAL SELF-CONTAINED PROXIMITY SENSOR FOR ATTACHMENT TO A NIGHT-VISION DEVICE

FIELD

The field hereof is a night-vision technique and more specifically a universal proximity sensor attachable to a night-vision device of any type for automatically switching the device on when the device is in a viewing position and switching the device off when the device is removed from the viewing position. The device of the invention can be attached to optical sights equipped with night-vision devices, as well as to binoculars, monoculars, etc., in particular to optical systems with night-vision devices that radiate detectable infrared light for illuminating objects being observed.

BACKGROUND

Prior Art

Night-vision devices find wide application in various fields of technology such as homeland security, crime-prevention systems, hunting weapons, and, especially, in combat systems where night-vision devices are used in optical sights for aiming at objects at night time. The structure and types of night-vision devices used in the aforementioned fields to a great extent depend on specific conditions of application. For example, night-vision home-security systems may be activated during the entire night, while night-vision devices used in combat must be activated for as short a time as possible because during device activation, the user may become a target for an enemy provided with appropriate infrared-light receivers.

In view of the above, initial development of night-vision devices for military applications included devices that were equipped with switches for manually switching of the night-vision device only for the time of active use. Such a system was very inconvenient to use since a soldier had to spend time switching the device on and off under battle conditions. Therefore, the soldier often kept the night-vision device in an energized state for a long time in order to have it ready for immediate use at any time. Furthermore, during the harsh conditions of battle, the soldier could easily forget to switch the device off. As a result, the soldier became vulnerable to the enemy. Furthermore, long-time activation reduced the lifetime not only of the battery but also of the night-vision device as a whole. This is important since a night-vision device is an expensive piece of equipment that has a limited lifetime.

In order to eliminate the above disadvantages, night-vision devices of new generations were equipped with proximity sensors built into the body of the device. For example, one embodiment of U.S. Pat. No. 7,315,254 issued in 2008 to Smith, et al., discloses a night-vision device attachable to a weapon, e.g., a rifle. The device includes a housing that contains an intensifier tube and a built-in proximity sensor. An ON/OFF switch is operatively coupled to the intensifier tube and to the proximity sensor such that operation of the ON/OFF switch to the ON position automatically activates the proximity sensor.

A similar principle of incorporating a proximity sensor into the body of a night-vision device is realized in the construction of various night-vision systems developed and manufactured by American Technology Network (ATN). For example, an ATN MO4-1 is a first-generation night-vision monocular with built-in ATN smart technology in the form of a proximity sensor that automatically turns on the night-vision scope when it is brought in the viewing position. This helps to save battery life and the life of the unit as a whole. The scope also has a built-in power-infrared illuminator that allows observation of an object in total darkness. However, it should be taken into account that such an illuminator also operates from the master battery and may be activated and deactivated simultaneously with the scope, itself, which, as mentioned above, is an important safety factor for the user and for extending service life.

Nevertheless, both devices of the type described above have the following essential disadvantages. First, incorporation of the proximity sensor into the body of the night-vision optical device complicates the structure of the device and increases manufacturing expense. Second, malfunction of any component of the device, including the sensor, makes the entire device inoperative. Third, the proximity sensor has to be customized for each specific user and cannot be adjusted, e.g., for a left-hander or right-hander, and the proximity sensor cannot be placed into any other position on the night-vision device because it is incorporated into the device housing.

On the other hand, a great variety of various night-vision devices do not have proximity sensors. For example, ATN produces a high-performance, hand-held, night-vision monocular PS-14 that uses a single intensifier tube that reproduces crisp, clear images under the darkest conditions. It can be hand-held or installed in a head-mount. This complex opticoelectronic system consists of an objective lens assembly with 1:1 magnification, an eyepiece, and a body that contains an image-intensifier tube assembly with an integrated high-voltage power source and battery housing. The device provides a wide 40° field-of-view and up to 45 hours of operation on two 1.5-volt AA batteries. The construction is waterproof. The PS-14-2 model features a Generation 2 intensifier tube, and the PS-14-3A model features a Generation 3 intensifier tube. Third-generation optics have a greatly increased amount of light-gaining ability and resolution over other forms of night vision.

It is understood that specific proximity sensors that are built into the housings of specific night-vision devices cannot be attached or functionally connected directly to night-vision devices that originally were developed and produced without the intent of using such sensors.

OBJECTS AND SUMMARY OF THE INVENTION

It is an object of the present invention to provide a universal proximity sensor for night-vision devices that do not reveal the position of the user when the night-vision device is used. It is another object to provide a proximity sensor for a night-vision device that automatically switches the device ON when the device is in a viewing position and switches the device OFF when the device is removed from the viewing position. It is another object to provide a proximity sensor of the aforementioned type that can be attached to a night-vision device of any type, including one originally designed for use without a proximity sensor. It is a further object to provide a proximity sensor of the aforementioned type that can be installed in any position on the body of a night-vision device, e.g., on the left or right side of the device housing, as well as any distance from the viewer's eye that is convenient for optimal operative position. Another object is to provide a proximity sensor of the aforementioned type that is connected to the master battery of the night-vision device for switching on the master battery and, hence, the image-intensifier tube, only when the sensor detects that the eye of the viewer is in an operative position relative to the night-vision device. It is a further object to provide the proximity sensor of the aforementioned type that has means for easily attaching the sensor to the body of the night-vision device and for easily detaching the sensor from the device, thus making the sensor suitable for use with another night-vision device. Another object is to provide the proximity sensor of the aforementioned type with adapters for mechanical connection to a night-vision device (hereinafter referred to as "NVD") master battery compartment of any type or dimension.

The proposed proximity sensor is of a transmitter/receiver type and comprises a self-contained device with a circuit-supporting substrate that supports the battery for the sensor and elements of the circuit that control sensor operation and that are intended for wireless on-off switching of the NVD on which the sensor is installed. The proximity sensor is intended for use with a so-called single-battery NVD that employs a conventional low-voltage step-up circuit to convert battery voltage to an intermediate voltage, which is then supplied to a high-voltage step-up circuit needed for activation and operation of the image-intensifier tube.

The substrate has a holder that is arranged perpendicular to the substrate that supports an IR transmitter and a receiver. The entire sensor is closed by a cover that has respective openings for exposing the front ends of the IR transmitter and receiver. The control circuit of the proximity sensor consists of an infrared transmitter, photoreceiver, and a cable with a connection terminal for connection of the control circuit of the sensor to the master battery compartment of the NVD. The control circuit of the sensor contains a microprocessor installed on the circuit-supporting substrate. The microprocessor controls radiation from the IR transmitter and processes signals received from the photoreceiver. When an obstacle appears in front of the proximity sensor, e.g., the face of a viewer who uses the NVD, the photoreceiver receives the reflected IR signal and transmits this reflected signal to the microprocessor. The latter processes the obtained signal, and if the reflected signal coincides with a direct signal of the IR transmitter in given parameters, the microprocessor generates an output control signal. This output control signal is sent to an electronic switch, which closes contacts in the aforementioned connection terminal. Closing of these contacts electrically connects the battery of the NVD to the electronic circuit of the NVD, and the latter is activated. When there is no obstacle in the operation zone of the proximity sensor, a reflected signal is absent, and the photoreceiver transmits to the processor a signal testifying absence of the reflected signal. In this case, the processor generates a control command for switching off the electronic switch. Contacts of the connection terminal are opened, the master battery is disconnected from the control circuit of the NVD, and the latter is switched off.

A main distinguishing feature of the proximity sensor proposed herein is that the sensor is a self-contained device that is universal and can be mechanically attached to any electronic optical NVD and can be electrically connected to the master battery of such a device. For this purpose, the sensor is provided with means for attaching the sensor in any position on the housing of an NVD, while the connection terminal of the sensor cable is formed on a connector that corresponds to the shape of the cover that normally covers the housing of the master battery compartment. In order to provide connection to battery compartments of different types, shapes, and dimensions, the proximity sensor may be provided with a set of adapters having on one side a means for mechanical connection to the cable of the proximity sensor and on the other side a means for mechanical connection to the housing of the battery compartment. When it is necessary to connect the electrical circuit of the proximity sensor to the electrical circuit of the NVD, e.g., to one of the models that does not have a proximity sensor, the cover of the master battery compartment of the NVD is disconnected, and the terminal connector provided on the end of the proximity-sensor cable is mechanically connected to the master-battery housing directly to or through the adapter. When the aforementioned mechanical connection is completed, the electrical contacts of the proximity sensor are installed into a position appropriate for interaction with electrical contacts of the NVD.

The aforementioned means for connection of the sensor to any location on the NVD housing are made, e.g., in the form of two parts that can be connected by means of tiny hooks and loops (of the type known under the trademark "Velcro" of Velcro Co.), one part of which is attached, e.g., by means of adhesive connection, to the outer side of the circuit-supporting substrate, and another part, also through adhesive connection, to a selected area on the NVD housing.

BRIEF DESCRIPTION OF THE INVENTION

FIG. 6 is a front view of the night-vision device with the proximity sensor of the invention attached to the right side of the device if viewed in the direction of observation.

FIG. 7 is a fragmental sectional view that shows the terminal cable cap connected to the master-battery compartment of the night-vision device.

FIG. 7a is a sectional view of an adapter for connection of the terminal cable cap to the master battery compartment of a non-standard type.

DETAILED DESCRIPTION OF THE INVENTION

Figure 1:
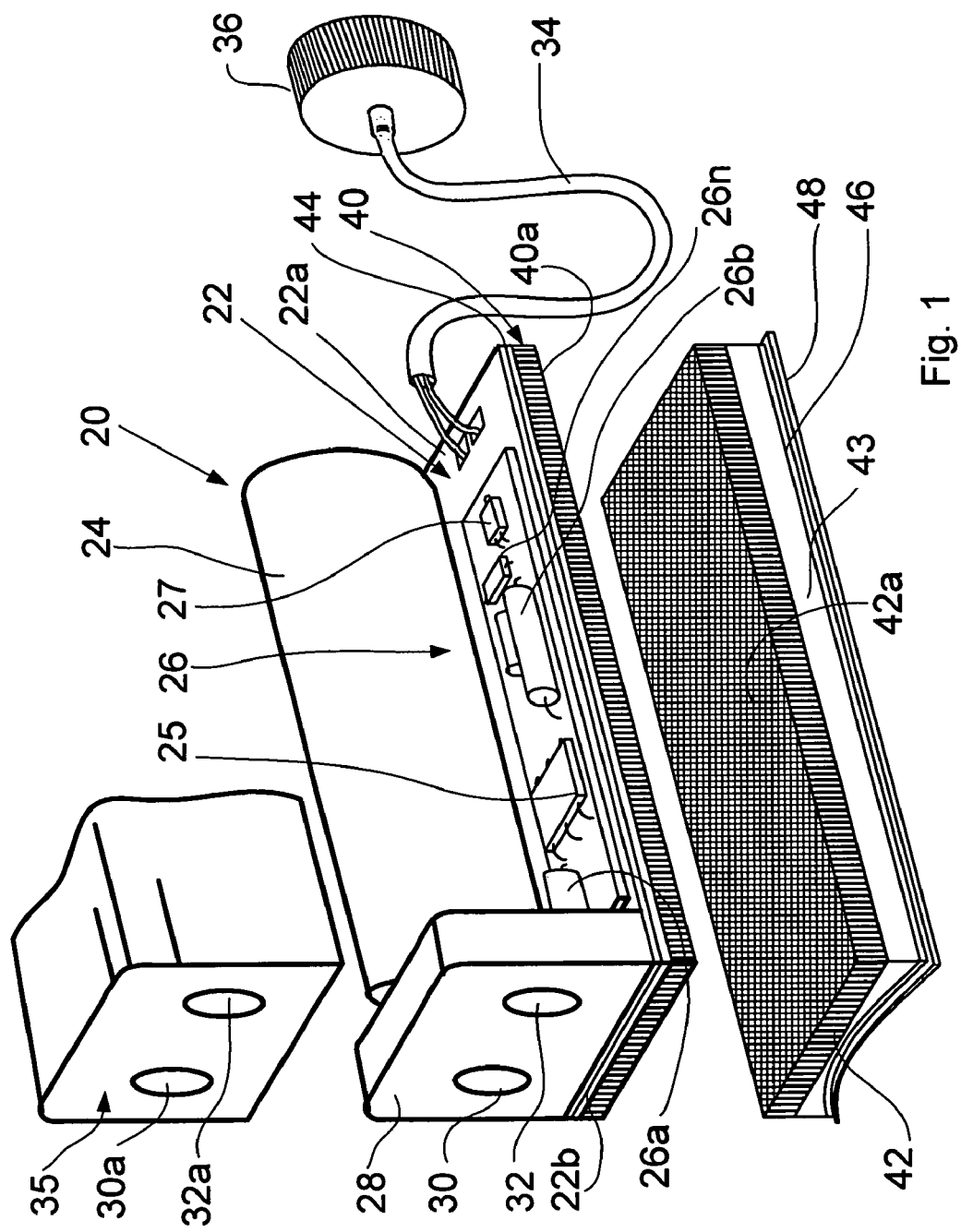
FIG. 1 is an exploded three-dimensional view of the transmitter-receiver type of proximity sensor of the invention.

An exploded three-dimensional view of a proximity sensor 20 of the invention is shown in FIG. 1. In general, the proximity sensor 20 consists of a circuit-supporting substrate 22 that has an inner side 22a and an outer side 22b and is comprised, e.g., of a silicon plate that supports a sensor battery 24 and elements 26a through 26n of a circuit 26 that controls operation of the sensor 20 and, in fact, is intended for wireless switching on and off of the NVD (not shown in FIG. 1) on which the proximity sensor 20 is to be installed. Elements 26a through 26n may comprise resistors, capacitors, lead wires, etc. The elements shown in FIG. I do not correspond to actual circuit elements or to actual wiring and are shown for illustrative purposes only.

The proximity sensor 20 is intended for use with a so-called single-battery NVD that employs a conventional low-voltage step-up circuit to convert battery voltage to an intermediate voltage, which is then supplied to a high-voltage step-up circuit needed to activate and operate the image-intensifier tube. Some NVDs are not always ready for immediate activation and need intermediate steps prior to connection to high voltage.

The substrate 22 has a holder 28 arranged perpendicular to the substrate 22. The holder 28 supports an IR transmitter 30 and a receiver 32 (not shown in FIG. 1). The entire sensor 20 is closed by a sensor cover 35, only a part of which is shown in FIG. 1, although it is assumed that the sensor cover 35 covers all elements 26a through 26n of the electrical circuit and the exposed upper part of the substrate 22 that supports these elements. The holder 28 has respective openings 30a and 32a for exposing the front ends of the IR transmitter 30 and receiver 32. The proximity sensor 20 also includes an electrical cable 34 with a connection terminal cap 36 at the free end for electrical connection of the control circuit 26 of the sensor 20 to the master battery and for mechanical connection of the electrical cable 34 to the master-battery compartment of the NVD (not shown in FIG. 1). Reference numeral 27 (FIG. 1) designates an electronic switch through which the optoelectronic image-intensifier tube (not shown) of the NVD is activated.

Figure 2:
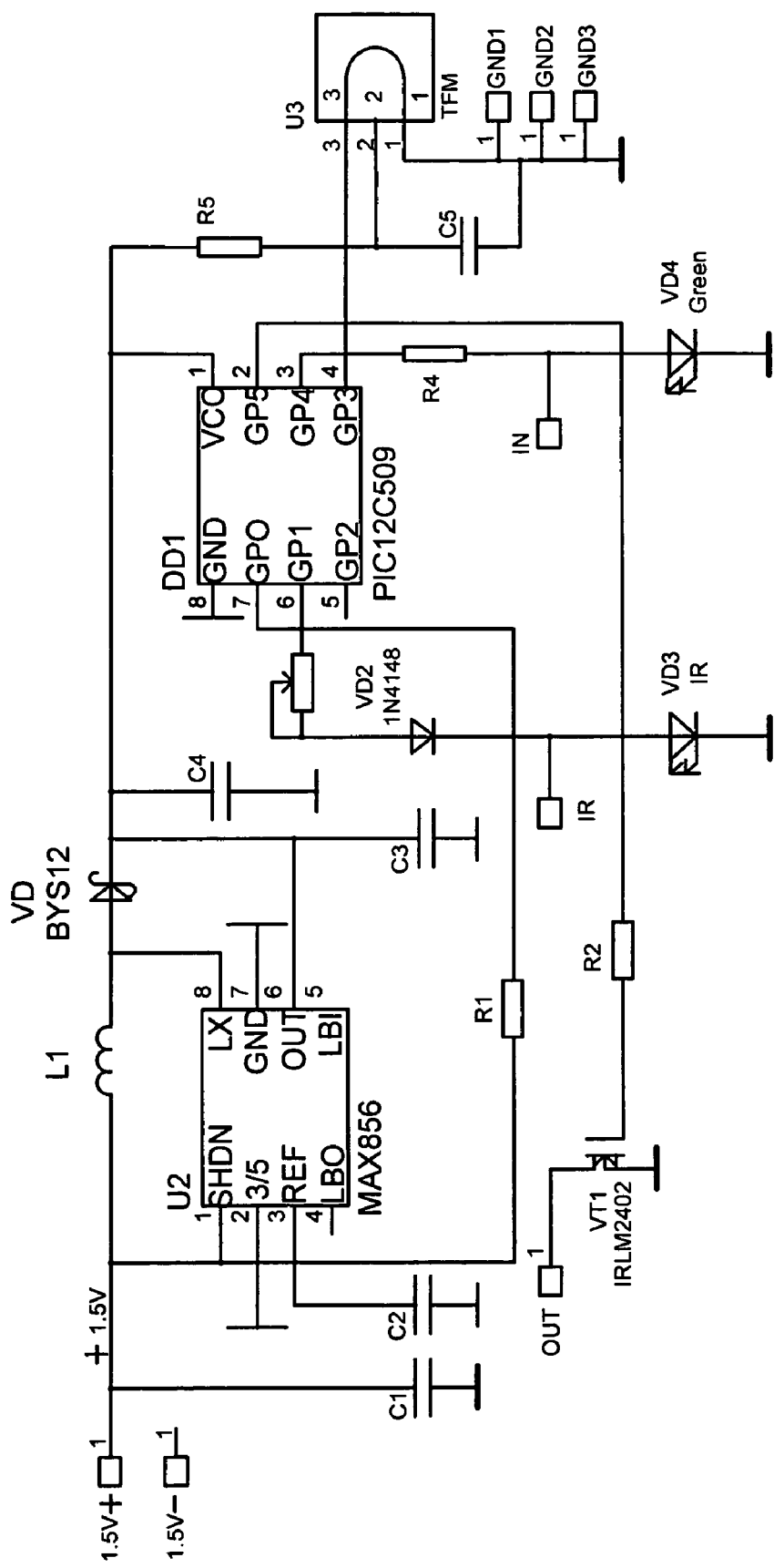
FIG. 2 is an electrical diagram of the sensor of FIG. 1.

FIG. 2 is an electrical diagram of the control circuit 26 of the sensor 20 of FIG. 1. In this diagram, reference numeral 25 designates a microprocessor installed on the circuit-supporting substrate 22 (FIG. 1). The microprocessor 25 controls optical radiation from the IR transmitter 30 and processes signals received from the photoreceiver 32. When an obstacle appears in front of the proximity sensor 20, e.g., the face of a viewer who uses the NVD, the photoreceiver 32 receives the reflected IR signal from the transmitter 30 and transmits this reflected signal to the microprocessor 25. The latter processes the obtained signal, and if the reflected signal coincides with a direct signal of the IR transmitter in given parameters, the microprocessor generates an output control signal. This output control signal is sent to an electronic switch 27 (FIG. 1), which closes contacts in the aforementioned connection terminal. Closing of these contacts electrically connects the battery of the NVD to the electronic circuit of the NVD, and the latter is activated. When there is no obstacle in the operation zone of the proximity sensor, a reflected signal is absent, and the photoreceiver 32 transmits a signal testifying that the reflected signal is absent to the processor. In this case, the processor generates a control command for switching off the electronic switch. Contacts of the connection terminal are opened, the master battery is disconnected from the control circuit of the NVD, and the latter is switched off. The above-described circuit is beyond the scope of the present invention and is shown and described only for illustrative purposes. It is understood that the functions of the circuit, which are shown in FIG. 2, can be accomplished by circuits having configurations other than those shown in FIG. 2.

Because use of the proximity sensor 20 causes the NVD to be activated for only a short time during actual aiming toward a target, the sensor provides the NVD with camouflage features that assist in hiding the location of the NVD user from the enemy.

A main distinguishing feature of the proximity sensor proposed herein is that the sensor is a self-contained device that is universal and can be mechanically attached to any electronic optical NVD and electrically connected to the master battery of such a device. For this purpose, the sensor is provided with means for attaching the sensor in any position on the housing of an NVD, while the connection terminal of the sensor cable is formed on a connector that corresponds to the shape of the cover that normally covers the housing of the master battery compartment. In order to provide connection to battery compartments of different types, shapes, and dimensions, the proximity sensor is provided with a set of adapters having on one side a means for mechanical connection to the cable of the proximity sensor and on the other side a means for mechanical connection to the housing of the battery compartment. When it is necessary to connect the electrical circuit of the proximity sensor to the electrical circuit of the NVD, e.g., to one of the models that do not have a proximity sensor, the cover of the master battery compartment of the NVD is disconnected, and the terminal connector provided on the end of the proximity-sensor cable is mechanically connected to the master-battery housing directly or through the adapter. When the aforementioned mechanical connection is completed, the electrical contacts of the proximity sensor are installed into a position for appropriate interaction with electrical contacts of the NVD.

As shown in FIG. 1, the aforementioned means for connection of the sensor to any location on the NVD housing are made, e.g., in the form of two engagement connection parts 40 and 42 connectable through tiny hooks 40a, e.g., on the engagement connection part 40, and tiny loops 42a on the engagement connection part 42 (this connection is known under the trademark "Velcro" of Velcro USA Inc.). One part, e.g. part 40, is attached, e.g., by means of adhesive layer 44 to the external side 22b of the circuit-supporting substrate 22, and another part 42 also has an adhesive layer 46 for adhesive connection to an intermediate portion 43 which is curved in accordance with the curvature on the outer surface of the NVD housing to which the sensor is attached (not shown in FIG. 1). For protection purposes, the adhesive layer 46 can be covered by a peelable protective sheet 48. When the proximity sensor is stored or transported, the parts 40 and 42 can be connected in a known manner through interaction of hooks and respective loops.

Figure 3:
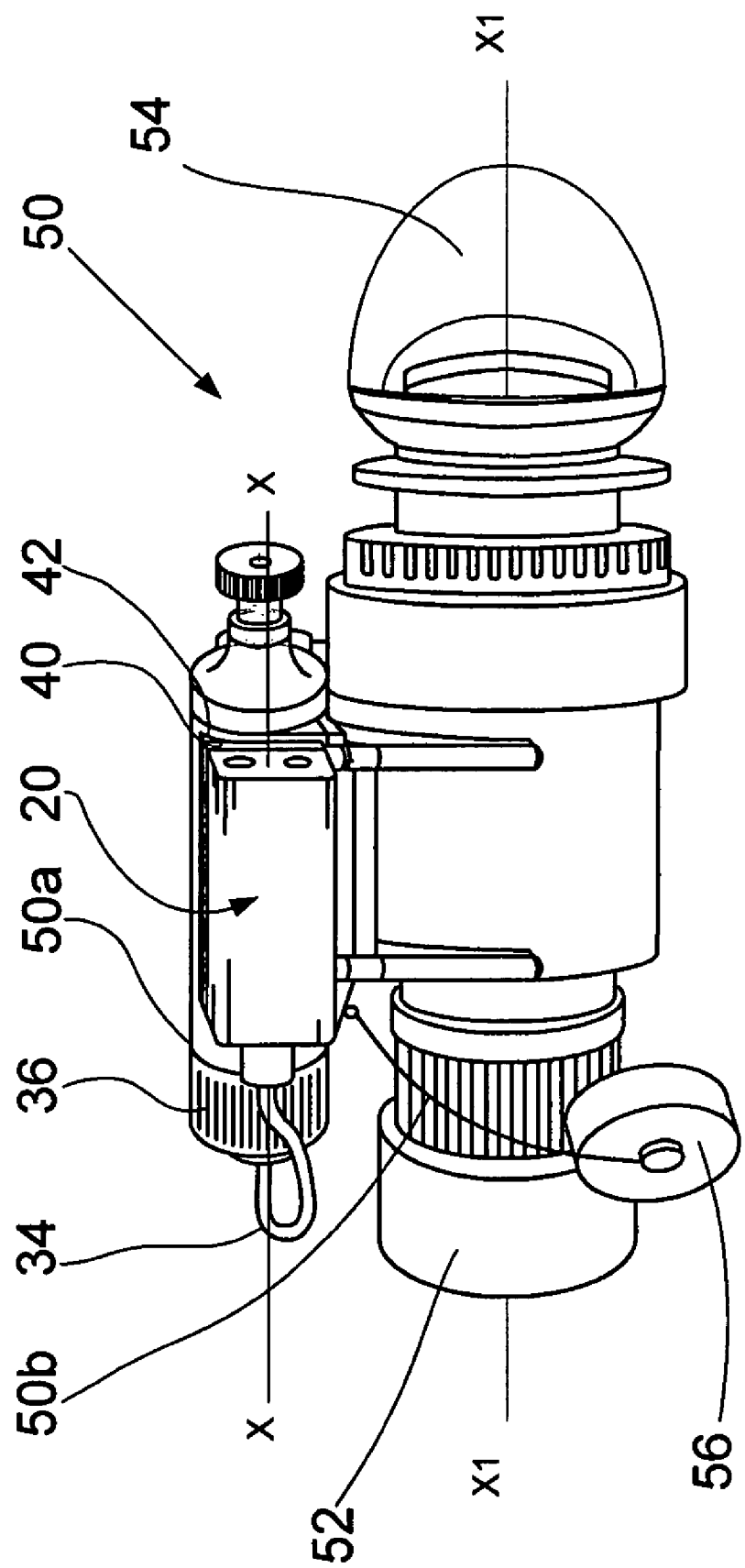
FIG. 3 is a three-dimensional view of the sensor of FIG. 1 installed on a night-vision device.

FIG. 3 is a three-dimensional view of the proximity sensor 20 of FIG. 1 installed on a night-vision device (NVD) 50. In the illustrated case, the NVD is an optical monocular, e.g., a high-performance, hand-held, night-vision monocular PS-14 produced by ATN Corporation that uses a single intensifier tube reproducing crisp, clear images under the darkest conditions. In this drawing, reference numeral 52 designates an objective lens, reference numeral 54 designate an eyepiece, reference numeral 56 designates the cover of the master-battery compartment of the NVD 50, and reference numeral 36 designates the connection terminal cap intended for mechanically connecting the electrical cable 34 to the master-battery compartment 50a of the NVD 50 instead of the cover 56 and for electrically connecting the electrical terminal 376a of the cable with the master battery 37 (FIG. 7). This is shown in FIG. 7, which is a fragmental sectional view that shows the terminal cable cap connected to the master-battery compartment of the NVD. The disconnected cover 56 may remain attached to the NVD housing by a cord 50b (FIG. 3) or removed and stored in another place. In FIG. 3, reference numeral 34 designates the electrical cable that electrically connects the proximity sensor 20 with the NVD. The image-intensifying tube is located inside the NVD housing and is not shown in the drawings since the structure of this tube is beyond the scope of the present invention.

For attachment to the NVD, such as the NVD 50, the engagement connection part 42 is disconnected from the engagement connection part 40, and the protective sheet 48 (FIG. 1) is peeled from the engagement connection part 42 whereby the adhesive layer 46 is exposed. The engagement connection part 42 is then adhesively attached by means of the adhesive layer 46 to a selected area of the NVD 50, e.g., to the housing of the master battery compartment 50a (FIG. 3). The proximity sensor 20 is then attached to the engagement connection part 42 through the engagement connection of the part 40 to the latter.

The longitudinal axis X-X of the proximity sensor 20 is arranged preferably parallel to the longitudinal axis X1-X1 of the NVD 50, while the transmitter 30 and receiver 32 are arranged in a position most optimal for the NVD user, e.g., 70 to 80 mm from the user's eye when the user views a target through the NVD 50. It can be seen from FIG. 3 that the proximity sensor 20 is attached to the NVD 50 in a selected position, with openings 30a and 32a facing the viewer's side.

Figure 4:
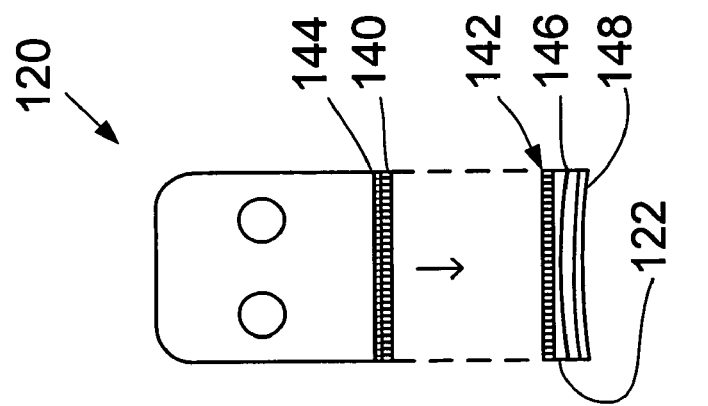
FIG. 4 is a front view of the proximity sensor of FIG. 1 illustrating the multilayer structure for connection of the sensor to the night-vision device.

If the proximity sensor of the invention is attached to a curvilinear surface, then a sensor 120 of the type shown in FIG. 4 may have a substrate 122 with an external surface that corresponds in its curvature to the respective surface of the NVD. In FIG. 4, the parts in the previous embodiment are designated by the same reference numerals with an addition of the number 100. Thus, the substrate is designated by reference numeral 122, the first engagement connection part is designated by reference numeral 140, etc.

Except for substrate 122, the first engagement connection part 140, the adhesive layer 144, the second engagement connection layer 142, the adhesive layer 146, and the protective sheet 148 have curvilinear shapes, the remaining parts of the proximity sensor 120 are the same as in previous embodiments.

Figure 5:
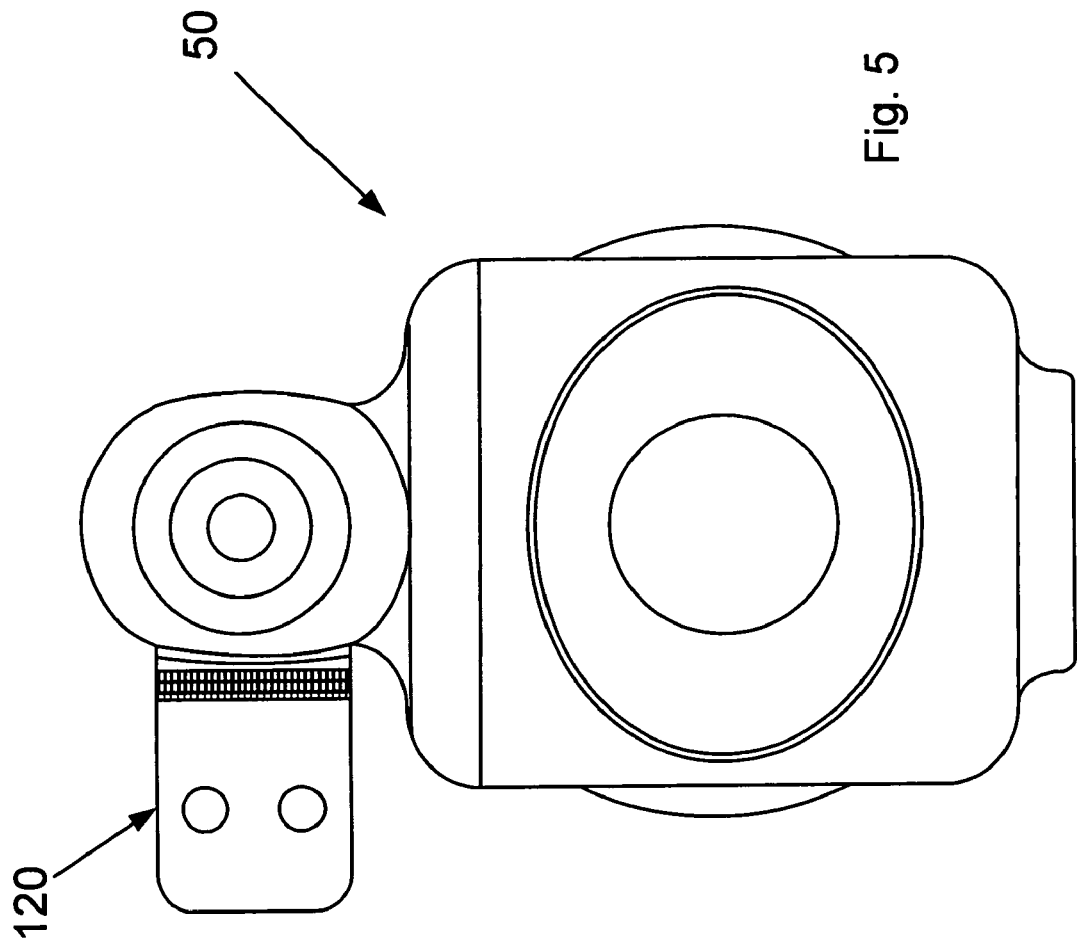
FIG. 5 is a front view of the night-vision device with the proximity sensor of the invention attached to the left side of the device if viewed in the direction of observation.

As has been mentioned above, the proximity sensor of the invention can be attached to any area of the NVD. Thus, as shown in FIG. 5, the proximity sensor 120 is attached to the left side of the NVD 50 if one looks in the direction of observation, while in FIG. 6 the sensor 120 is shown on the right side of the NVD.

If the connection features of the terminal cap 36 do not match the connection features of the master-battery compartment 50a (FIG. 3) to which the cap 36 is attached mechanically and to which the electrical contacts are connected electrically, the proximity sensor 20 (120) may be provided with an adapter 60 of the type shown in FIG. 7.

For example, if the cap 36 has an outer thread 36a that is to be threaded into the inner thread 62 formed on the end of the master-battery compartment 50a, the connection can be made through the adapter 60, the outer thread 36b of which can be connected to the inner thread 62 of the compartment 50a and the outer thread 60a to the inner thread of the cap 36.

Thus it has been shown that the invention provides a universal proximity sensor for night-vision devices that automatically switches the device on when the device is in a viewing position and switches the device off when the device is removed from the viewing position. The proximity sensor can be attached to a night-vision device of any type, including one originally designed for use without a proximity sensor. The proximity sensor can be installed in any position on the body of the night vision device, e.g., on the left or right side of the device housing, as well as at any distance from the viewer's eye that is convenient for optimal operative position. The sensor is connected to the master battery of the night-vision device for switching on the master battery and, hence, the image-intensifier tube, only when the sensor detects the viewer's eye to be in the operative position relative to the night-vision device. The sensor has means for easy attachment to the body of the night-vision device and for easy detachment of the sensor from the device, thus making the sensor suitable for use with another night-vision device. Finally, the proximity sensor of the invention is provided with adapters for attachment to the NVD master battery compartment of any type and dimension.

Although the invention has been shown and described with reference to specific embodiments, it is understood that these embodiments should not be construed as limiting the areas of application of the invention and that any changes and modifications are possible provided that these changes and modifications do not depart from the scope of the attached patent claims. For example, the sensor connection means may comprise bolts, screws, straps, or clamps. The NVDs may be other than monoculars, e.g., binoculars, goggles, etc. The proximity sensor can be used as replacements instead of built-in sensors, the housings of the sensor may have shapes different from those shown in the drawings, and the sensor may be of a capacitor type.

The invention claimed is:

1. A universal self-contained proximity sensor for attachment to a night-vision device having a master-battery compartment for a master battery of the night-vision device, said master battery compartment being closed by a cover, the universal proximity sensor comprising:
    a circuit-supporting substrate having an inner side and an outer side;
    a control circuit supported by the inner side of the circuit-supporting substrate and comprising a transmitter, a receiver, and a microprocessor for processing signals obtained from the transmitter and the receiver;
    a sensor cover that covers the control circuit and the inner side of the circuit-supporting substrate;
    attachment means on the outer side of the circuit-supporting substrate for attachment of the universal proximity sensor to the selected night-vision device; and
    an electrical cable for electrically connecting the control circuit with the master-battery compartment of the night-vision device.

2. The universal self-contained proximity sensor of claim 1, wherein said attachment means comprise engagement connection parts.

3. The universal self-contained proximity sensor of claim 2, wherein the engagement connection parts comprise a first engagement connection part attached to the outer side of the circuit-supporting substrate and a second engagement connection part, one side of which is intended for connection to the first engagement connection part and the other side for connection to the night-vision device.

4. The universal self-contained proximity sensor of claim 3, wherein one of the first engagement connection part and the second engagement connection part has a plurality of tiny hooks, while another of the first engagement connection part and the second engagement connection part has tiny loops engageable with said tiny hooks.

5. The universal self-contained proximity sensor of claim 3, wherein the first engagement connection means has an adhesive layer through which it is connected to the outer side of the circuit-supporting substrate.

6. The universal self-contained proximity sensor of claim 4, wherein the first engagement connection means has an adhesive layer through which it is connected to the outer side of the circuit-supporting substrate.

7. The universal self-contained proximity sensor of claim 3, wherein the second engagement connection means has an adhesive layer for connection thereof to a night-vision device.

8. The universal self-contained proximity sensor of claim 5, wherein the first engagement connection means has an adhesive layer through which it is connected to the outer side of the circuit-supporting substrate.

9. The universal self-contained proximity sensor of claim 5, wherein the second engagement connection means has an adhesive layer for connection thereof to a night-vision device.

10. The universal self-contained proximity sensor of claim 1, wherein the electrical cable for electrically connecting the control circuit with the master-battery compartment of the night-vision device has a connection terminal cap at the free end thereof for electrical connection of the control circuit of the proximity sensor to the master battery and for mechanical connection of the electrical cable to the master-battery compartment of the night-vision device.

11. The universal self-contained proximity sensor of claim 2, wherein the electrical cable for electrically connecting the control circuit with the master-battery compartment of the night-vision device has a connection terminal cap at the free end thereof for electrical connection of the control circuit of the proximity sensor to the master battery and for mechanical connection of the electrical cable to the master-battery compartment of the night-vision device.

12. The universal self-contained proximity sensor of claim 3, wherein the electrical cable for electrically connecting the control circuit with the master-battery compartment of the night-vision device has a connection terminal cap at the free end thereof for electrical connection of the control circuit of the proximity sensor to the master battery and for mechanical connection of the electrical cable to the master-battery compartment of the night-vision device.

13. The universal self-contained proximity sensor of claim 8, wherein the electrical cable for electrically connecting the control circuit with the master-battery compartment of the night-vision device has a connection terminal cap at the free end thereof for electrical connection of the control circuit of the proximity sensor to the master battery and for mechanical connection of the electrical cable to the master-battery compartment of the night-vision device.

14. The universal self-contained proximity sensor of claim 9, wherein the electrical cable for electrically connecting the control circuit with the master-battery compartment of the night-vision device has a connection terminal cap at the free end thereof for electrical connection of the control circuit of the proximity sensor to the master battery and for mechanical connection of the electrical cable to the master-battery compartment of the night-vision device.

15. The universal self-contained proximity sensor of claim 1, wherein said outer side of the circuit-supporting substrate has a curvature that corresponds to the surface of the night-vision device to which the sensor is to be attached.

16. The universal self-contained proximity sensor of claim 2, wherein said outer side of the circuit-supporting substrate has a curvature that corresponds to the surface of the night-vision device to which the sensor is to be attached.

17. The universal self-contained proximity sensor of claim 3, wherein said outer side of the circuit-supporting substrate has a curvature that corresponds to the surface of the night-vision device to which the universal proximity sensor is to be attached.

18. The universal self-contained proximity sensor of claim 4, wherein said outer side of the circuit-supporting substrate has a curvature that corresponds to the surface of the night-vision device to which the universal proximity sensor is to be attached.

19. The universal self-contained proximity sensor of claim 13, wherein said outer side of the circuit-supporting substrate has a curvature that corresponds to the surface of the night-vision device to which the universal proximity sensor is to be attached.

20. The universal self-contained proximity sensor of claim 14, wherein said outer side of the circuit-supporting substrate has a curvature that corresponds to the surface of the night-vision device to which the universal proximity sensor is to be attached.

* * * * *